United States Patent
Lee et al.

(10) Patent No.: US 12,451,469 B2
(45) Date of Patent: Oct. 21, 2025

(54) DISPLAY MODULE AND DISPLAY APPARATUS INCLUDING THE SAME

(71) Applicant: SAMSUNG ELECTRONICS CO., LTD., Suwon-si (KR)

(72) Inventors: Kwangjae Lee, Suwon-si (KR); Sungsoo Jung, Suwon-si (KR); Seonghwan Shin, Suwon-si (KR); Pilyong Oh, Suwon-si (KR); Jeongin Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 541 days.

(21) Appl. No.: 17/939,636

(22) Filed: Sep. 7, 2022

(65) Prior Publication Data

US 2022/0415865 A1 Dec. 29, 2022

Related U.S. Application Data

(63) Continuation of application No. PCT/KR2021/004620, filed on Apr. 13, 2021.

(30) Foreign Application Priority Data

Apr. 24, 2020 (KR) .......................... 10-2020-0050278

(51) Int. Cl.
*H01L 25/075* (2006.01)
*H10H 20/857* (2025.01)

(52) U.S. Cl.
CPC ....... *H01L 25/0753* (2013.01); *H10H 20/857* (2025.01)

(58) Field of Classification Search
CPC .......................... H01L 25/0753; H10H 20/857
See application file for complete search history.

(56) References Cited

U.S. PATENT DOCUMENTS 10,978,626 B2 * 4/2021 Park ..................... H10H 20/854
11,934,058 B2 3/2024 Jeong et al.
(Continued)

FOREIGN PATENT DOCUMENTS

JP 2012-160534 A 8/2012
JP 2015-185682 A 10/2015
(Continued)

OTHER PUBLICATIONS

Wada, JP 2012160534, Aug. 2012 (Year: 2012).*
(Continued)

*Primary Examiner* — Mary Ellen Bowman
(74) *Attorney, Agent, or Firm* — Sughrue Mion, PLLC

(57) ABSTRACT

A display module includes a substrate included a mounting surface on which a plurality of inorganic light emitting devices is mounted and a rear surface opposite the mounting surface, a metal plate facing the rear surface, and an adhesive layer provided between the rear surface of the substrate and the metal plate. An area of the substrate is equal to or greater than an area of the metal plate, the adhesive layer has an area corresponding to an area in which the metal plate faces the substrate, a coefficient of thermal expansion of the substrate is less than a coefficient of thermal expansion of the metal plate, and a ductility of the adhesive layer is greater than a ductility of the substrate and a ductility of the metal plate.

15 Claims, 10 Drawing Sheets

(56) References Cited

U.S. PATENT DOCUMENTS

2014/0313116 A1    10/2014  Jang et al.
2018/0190747 A1*    7/2018  Son ..................... H01L 25/0753
2022/0199594 A1*    6/2022  Shin ........................ G09G 5/18

FOREIGN PATENT DOCUMENTS

| JP | 2017-152109 A   | 8/2017  |
|----|-----------------|---------|
| JP | 2018-85495 A    | 5/2018  |
| KR | 10-2014-0108088 A | 9/2014  |
| KR | 10-1789126 B1   | 10/2017 |
| KR | 10-2017-0131137 A | 11/2017 |
| KR | 10-2018-0079078 A | 7/2018  |
| KR | 10-2018-0079080 A | 7/2018  |
| KR | 10-2020-0021399 A | 2/2020  |
| KR | 10-2020-0040482 A | 4/2020  |
| KR | 10-2021-0075820 A | 6/2021  |

OTHER PUBLICATIONS

International Search Report (PCT/ISA/210) issued by the International Searching Authority dated Jul. 27, 2021 in International Application No. PCT/KR2021/004620.
Written Opinion (PCT/ISA/237) issued by the International Searching Authority dated Jul. 27, 2021 in International Application No. PCT/KR2021/004620.
Communication issued on Apr. 19, 2024 by the Korean Intellectual Property Office for Korean Patent Application No. 10-2020-0050278.
Communication dated Sep. 30, 2024, issued by the Korean Intellectual Property Office in Korean Application No. 10-2020-0050278.

\* cited by examiner

DISPLAY MODULE AND DISPLAY APPARATUS INCLUDING THE SAME

CROSS-REFERENCE TO RELATED APPLICATION(S)

This application is a by-pass continuation of International Application No. PCT/KR2021/004620, filed on Apr. 13, 2021, in the Korean Intellectual Property Receiving Office, which is based on and claims priority to Korean Patent Application No. 10-2020-0050278, filed on Apr. 24, 2020, in the Korean Intellectual Property Office, the disclosures of which are incorporated by reference herein in their entireties

BACKGROUND

1. Field

The disclosure relates to a display apparatus that displays an image by combining modules in which an inorganic light emitting device, which is a self-luminous device, is mounted on a substrate.

2. Description of Related Art

A display apparatus is a type of output apparatus that visually displays data information such as text and figures, and images.

In general, as a display apparatus, a liquid crystal panel requiring a backlight or an organic light-emitting diode (OLED) panel composed of a film of an organic compound that emits light by itself in response to an electric current have been mainly used. However, the liquid crystal panel has a slow response time, high power consumption, does not emit light by itself, requiring a backlight, making it difficult to compact. The OLED panel does not need a backlight because it emits light by itself and may be made thin, but is vulnerable to a burn-in phenomenon in which as the lifespan of sub-pixels expires when the same screen is displayed for a long time, such that a specific part of the previous screen remains even if the screen is changed.

Accordingly, as a new panel to replace the above panels, an LED panel in which an inorganic light emitting device is mounted on a substrate and the inorganic light emitting device itself is used as a pixel is being studied.

This LED panel is also a self-luminous device, but does not cause the burn-in phenomenon of the OLED due to an inorganic light-emitting device. This LED panel has excellent luminance, resolution, power consumption, and durability.

In addition, the LED panel may be manufactured as a display module in a substrate unit by arranging LEDs on a circuit board in pixel units, and may be easily manufactured to have various resolutions and screen sizes depending on the order of consumer.

SUMMARY

Provided are a display module including an improved configuration for heat dissipation, and a display apparatus including the same.

Additional aspects will be set forth in part in the description which follows and, in part, will be apparent from the description, or may be learned by practice of the presented embodiments.

According to an aspect of the disclosure, a display module may include a substrate included a mounting surface on which a plurality of inorganic light emitting devices is mounted and a rear surface opposite the mounting surface, a metal plate facing the rear surface, and an adhesive layer provided between the rear surface of the substrate and the metal plate, wherein an area of the substrate may be equal to or greater than an area of the metal plate, the adhesive layer has an area corresponding to an area of the metal plate, a coefficient of thermal expansion of the substrate may be less than a coefficient of thermal expansion of the metal plate, and a ductility of the adhesive layer may be greater than a ductility of the substrate and a ductility of the metal plate.

The display module may further include a driving circuit board provided at the rear of the metal plate in a direction in which the rear surface faces, and a flexible film including a first end connected to the substrate and a second end connected to the driving circuit board such that the flexible film electrically connects the plurality of inorganic light emitting devices and the driving circuit board.

The metal plate may include a metal plate cutout portion configured to allow the flexible film to penetrate the metal plate.

The substrate further may include a connection pad provided on the rear surface of the substrate to connect the plurality of inorganic light emitting devices and the first end of the flexible film, and the metal plate cutout portion may be formed at a position where the connection pad and the first end of the flexible film are connected in the direction in which the rear surface faces.

The metal plate cutout portion may include a passing hole configured to allow the flexible film to penetrate the metal plate.

The adhesive layer may include an adhesive layer cutout portion configured to allow the flexible film to penetrate the adhesive layer.

The substrate may include a connection pad provided on the rear surface and configured to connect the plurality of inorganic light emitting devices and the first end of the flexible film, and the adhesive layer cutout portion may include a passing hole formed at a position where the connection pad and the first end of the flexible film are connected.

The adhesive layer may include an adhesive layer cutout portion configured to allow the flexible film to penetrate the adhesive layer, and the adhesive layer cutout portion may be provided at a position corresponding to a position of the metal plate cutout portion.

The metal plate cutout portion may include a shape corresponding to a shape of the adhesive layer cutout portion.

The adhesive layer may include an inorganic adhesive tape including a first surface adhered to the rear surface and a second surface adhered to the metal plate.

The adhesive layer may be formed by mixing a first material including an adhesiveness and a second material having a higher heat dissipation performance than the first material.

The metal plate may include a first surface facing the adhesive layer and a second surface opposite side the first surface, and the driving circuit board may be provided on the second surface of the metal plate.

The metal plate may be provided on the rear surface at a position that more inside with respect to a center of the substrate than a position where the first end of the flexible film is connected to the substrate.

According to an aspect of the disclosure, a display apparatus may include a display module array including display modules horizontally arranged in an M*N matrix, where each of the plurality of display modules may include a substrate including a mounting surface on which a plurality of inorganic light emitting devices is mounted and a rear surface opposite the mounting surface, a metal plate facing the rear surface of the substrate and configured to dissipate heat generated from the substrate, and an adhesive layer provided between the rear surface of the substrate and the metal plate, wherein n area of the substrate may be equal to or greater than an area of the metal plate, the adhesive layer has an area corresponding to an area of the metal plate, a coefficient of thermal expansion of the substrate may be provided to be less than a coefficient of thermal expansion of the metal plate, and a ductility of the adhesive layer may be greater than a ductility of the substrate and a ductility of the metal plate.

The display apparatus may include a chassis on which the display modules are supported. Each of the display modules may include a coupling member including a first surface adhered to each of the plurality of display modules and a second surface adhered to the chassis such that the chassis and each of the plurality of display modules are coupled.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
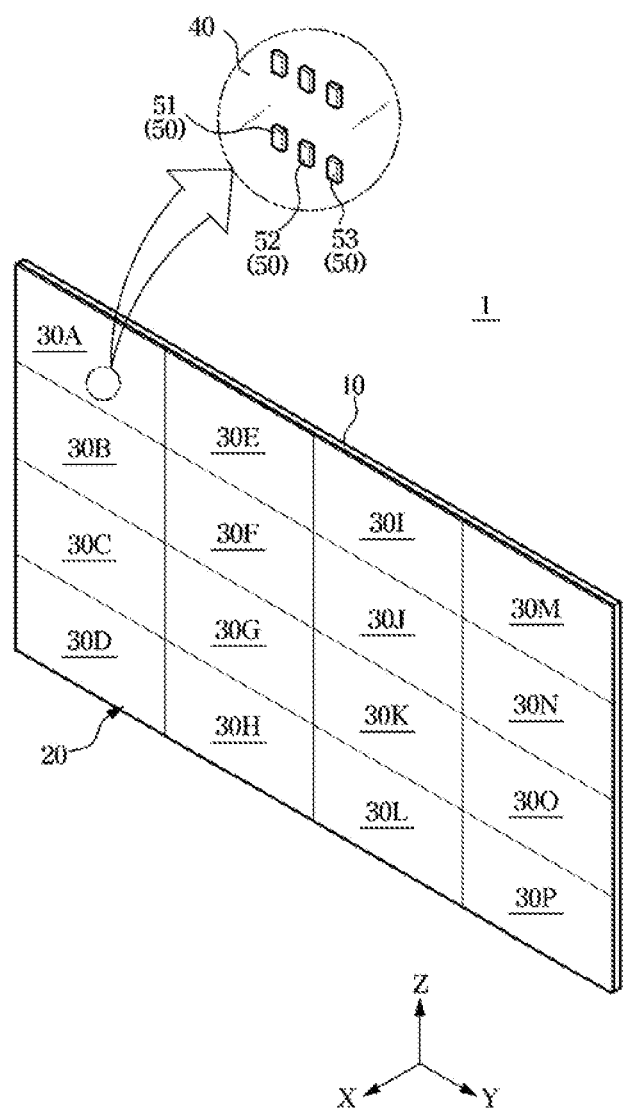
FIG. 1 is a diagram of a display apparatus according to an embodiment of the disclosure.

The embodiments described in the present specification and the configurations shown in the drawings are only examples of preferred embodiments of the present disclosure, and various modifications may be made at the time of filing of the present disclosure to replace the embodiments and drawings of the present specification.

The singular expressions described herein may include plural expressions, unless the context clearly dictates otherwise. The shapes and sizes of elements in the drawings may be exaggerated for clear explanation.

In this specification, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

In this specification, the meaning of 'same' means 'substantially identical'. It should be understood that values corresponding to differences within a range that do not have a meaning with respect to a reference value or a numerical value corresponding to a manufacturing error range are included in the range of 'the same'

In the drawings, identical or similar reference numerals may be used to refer to identical or similar components.

Hereinafter, embodiments of the present disclosure will be described in detail with reference to the accompanying drawings.

A display module according to an embodiment of the present disclosure may effectively dissipate heat generated from a substrate by a metal plate having an area substantially corresponding to an area of the substrate and capable of dissipating heat and a heat dissipation tape formed to have an area corresponding to the area of the metal plate.

A display apparatus according to an embodiment of the present disclosure may increase rigidity of the display module by the metal plate having a size corresponding to the substrate and an adhesive layer disposed between the metal plate and the substrate.

Figure 2:
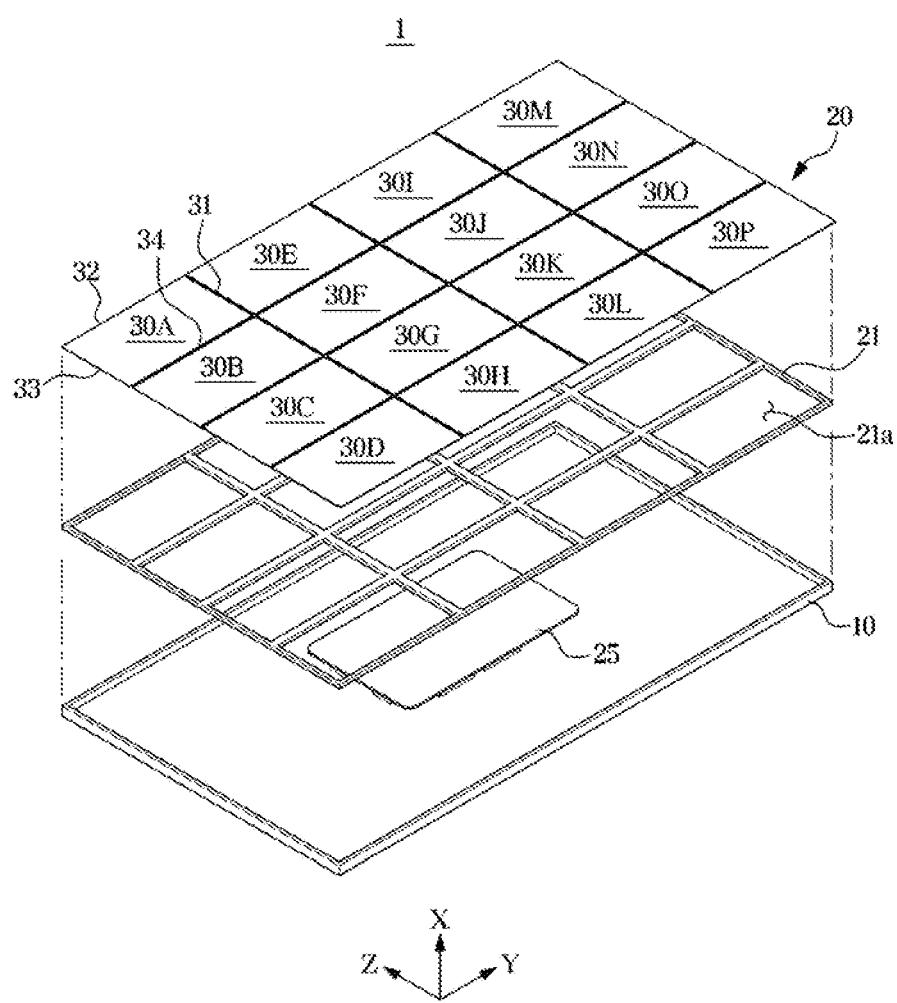
FIG. 2 is an exploded view illustrating components of the display apparatus illustrated in FIG. 1 according to an embodiment of the disclosure.
Figure 3:
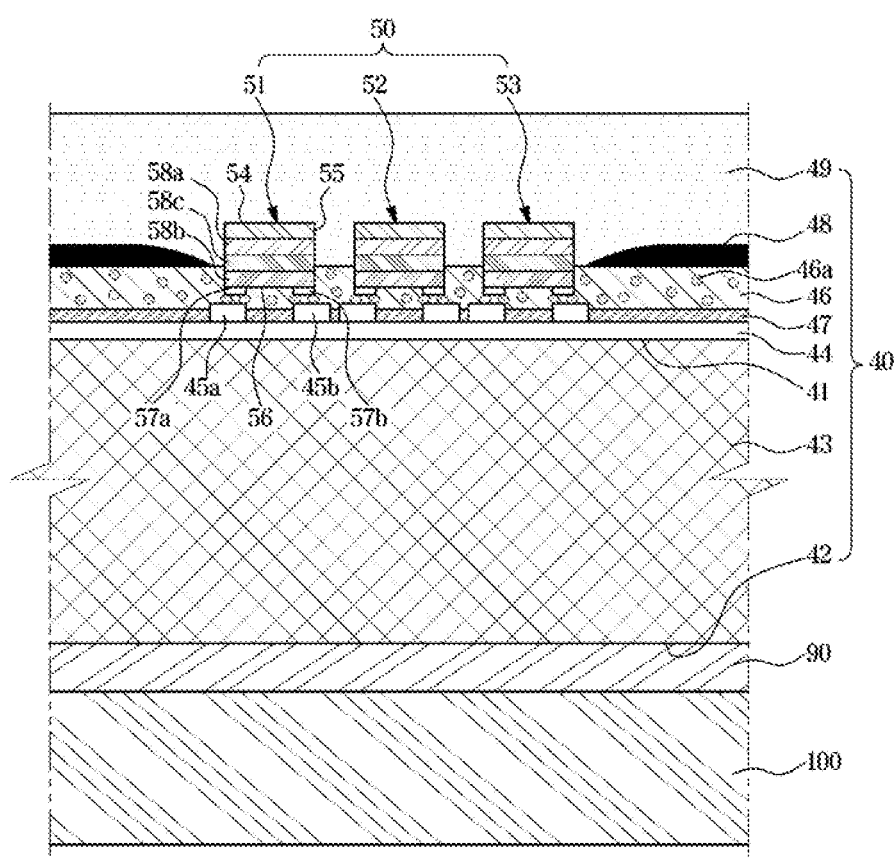
FIG. 3 is an enlarged cross-sectional view of components of one display module illustrated in FIG. 1 according to an embodiment of the disclosure.

FIG. 1 is a diagram of a display apparatus according to an embodiment of the disclosure. FIG. 2 is an exploded view illustrating components of the display apparatus illustrated in FIG. 1, according to an embodiment of the disclosure. FIG. 3 is an enlarged cross-sectional view of components of one display module illustrated in FIG. 1, according to an embodiment of the disclosure.

Some components of a display apparatus 1 including a plurality of inorganic light emitting devices 50, which are illustrated in the drawings, are micro-scale components having a size of several to hundreds of μm, and the scales of some components (e.g., the plurality of inorganic light emitting devices 50, a black matrix 80, etc.) are exaggerated for convenience of description.

The display apparatus 1 is a device that displays information, materials, data, etc. in characters, figures, graphs, images, etc., and a television (TV), a personal computer (PC), a mobile phone, digital signage, etc. may be implemented as the display apparatus 1.

According to an embodiment of the present disclosure, as illustrated in FIGS. 1 and 2, the display apparatus 1 may include a display panel 20 provided to display an image, a power supply device provided to supply power to the display panel 20, a main board 25 provided to control the overall operation of the display panel 20, and a frame 21 provided to support the display panel 20, and a rear cover 10 provided to cover a rear surface of the frame 21.

The display panel 20 may include a plurality of display modules 30A-30P, a driving board provided to drive each of the display modules 30A-30P, and a timing controller board (TOCN) provided to generate a timing signal required for control of each of the display modules 30A-30P.

The rear cover 10 may support the display panel 20. The rear cover 10 may be installed on a floor through a stand, or may be installed on a wall through a hanger.

The plurality of display modules 30A-30P may be arranged vertically and horizontally to be adjacent to each other. The plurality of display modules 30A-30P may be arranged in the form of an M*N matrix. In the present embodiment, the plurality of display modules 30A-30P includes 16 modules and are arranged in the form of a 4*4 matrix, but the number and arrangement method of the plurality of display modules 30A-30P are not limited.

The plurality of display modules 30A-30P may be installed on the frame 21. The plurality of display modules 30A-30P may be installed on the frame 21 through various known methods such as a magnet generating a magnetic force and a mechanical fitting structure. The rear cover 10 is coupled to the rear of the frame 21, and may form a rear exterior of the display apparatus 1.

By a coupling member 60 functioning as an adhesive tape disposed on the rear of the plurality of display modules 30A-30P, which will be described later, the frame 21 and the plurality of display modules 30A-30P may be adhered.

Rear sides of the plurality of display modules 30A-30P may be supported on the frame 21 by the coupling member 60.

As such, the display apparatus 1 according to an embodiment of the present disclosure may implement a large screen by tiling the plurality of display modules 30A-30P.

The plurality of display modules 30A-30P may have the same configuration.

Therefore, the description of any one display module described below may be equally applied to all other display modules.

Taking the first display module 30A among the plurality of display modules 30A-30P as an example, the first display module 30A may be formed in a quadrangle type. The first display module 30A may have a shape of a rectangle type or a shape of a square type.

Therefore, the first display module 30A may include edges 31, 32, 33, and 34 formed in up, down, left, and right directions based on a first direction X, which is a forward direction.

As illustrated in FIG. 3, each of the plurality of display modules 30A-30P may include a substrate 40 and a plurality of inorganic light emitting devices 50 mounted on the substrate 40. The plurality of inorganic light emitting devices 50 may be mounted on a mounting surface 41 of the substrate 40 directing to the first direction X.

The substrate 40 may be formed in the quadrangle type. As described above, each of the plurality of display modules 30A-30P may have a rectangular shape, and the substrate 40 may be formed in the quadrangle type to correspond thereto.

The substrate 40 may have a shape of the rectangle type or a shape of the square type.

Therefore, taking the first display module 30A as an example, the substrate 40 may include four edges corresponding to the edges 31, 32, 33, and 34 of the first display module 30A formed in the up, down, left, and right directions based on the first direction X, which is the front direction.

The substrate 40 may include a base substrate 43, the mounting surface 41 forming one surface of the base substrate 43, and a rear surface 42 forming the other surface of the base substrate 43 and disposed on an opposite side of the mounting surface 41.

The substrate 40 may include a thin film transistor (TFT) layer 44 formed on the base substrate 43 to drive the inorganic light emitting devices 50. The base substrate 43 may include a glass substrate. That is, the substrate 40 may include a substrate of a chip on glass (COG) type. First and second pad electrodes 45a and 45b provided to electrically connect the inorganic light emitting devices 50 to the TFT layer 44 may be formed on the substrate 40.

The plurality of inorganic light emitting devices 50 are formed of an inorganic material, and may include inorganic light emitting devices having sizes of several to several tens of μm in width, length, and height, respectively. The micro-inorganic light emitting device may have a size of 100 μm or less in a short side among width, length, and height. That is, the inorganic light emitting device 50 may be picked up from a silicon wafer and directly transferred onto the substrate 40. The plurality of inorganic light emitting devices 50 may be picked up and transported through an electrostatic method using an electrostatic head or a stamp method using an elastic polymer material such as polydimethylsiloxane (PDMS) and silicone as a head.

The plurality of inorganic light emitting devices 50 may be a light emitting structure including an n-type semiconductor 58a, an active layer 58c, a p-type semiconductor 58b, a first contact electrode 57a, and a second contact electrode 57b.

One of the first contact electrode 57a and the second contact electrode 57b may be provided to be electrically connected to the n-type semiconductor 58a, and the other may be provided to be electrically connected to the p-type semiconductor 58b.

The first contact electrode 57a and the second contact electrode 57b may have a flip chip shape horizontally disposed and disposed in the same direction (e.g., a direction opposite to an emission direction).

The inorganic light emitting device 50, when mounted on the mounting surface 41, has a light emitting surface 54 disposed toward the first direction X, a side surface 55, and a bottom surface 56 disposed on an opposite side of the light emitting surface 54, and the first contact electrode 57a and the second contact electrode 57b may be formed on the bottom surface 56.

That is, the contact electrodes 57a and 57b of the inorganic light emitting device 50 may be disposed on the opposite side of the light emitting surface 54, and thus may be disposed on an opposite side in a direction in which light is irradiated.

The contact electrodes 57a and 57b may be disposed to face the mounting surface 41 and may be provided to be electrically connected to the TFT layer 44, and the light emitting surface 54 irradiating light in a direction opposite to a direction in which the contact electrodes 57a and 57b are disposed may be disposed.

Therefore, when light generated from the active layer 58c is irradiated in the first direction X through the light emitting surface 54, the light may be irradiated toward the first direction X without interference of the first contact electrode 57a or the second contact electrode 57b.

That is, the first direction X may be defined as a direction in which the light emitting surface 54 is disposed to irradiate light.

The first contact electrode 57a and the second contact electrode 57b may be electrically connected to the first pad electrode 45a and the second pad electrode 45b formed on the mounting surface 41 side of the substrate 40, respectively.

The inorganic light emitting device 50, which will be described later, may be directly connected to the pad electrodes 45a and 45b through an anisotropic conductive layer 46 or an adhering structure such as solder.

The anisotropic conductive layer 46 may be formed on the substrate 40 to enable electrical bonding between the contact electrodes 57a and 57b and the pad electrodes 45a and 45b. The anisotropic conductive layer 46 may have a structure in which an anisotropic conductive adhesive is attached on a protective film and conductive balls 46a are dispersed in an adhesive resin. The conductive ball 46a, which is a conductive sphere surrounded by a thin insulating film, may electrically connect a conductor and a conductor to each other as the insulating film is broken by a pressure.

The anisotropic conductive layer 46 may include an anisotropic conductive film (ACF) in a film form and an anisotropic conductive paste (ACP) in a paste form.

Accordingly, in a case where a pressure is applied to the anisotropic conductive layer 46 when the plurality of inorganic light emitting devices 50 are mounted on the substrate 40, the insulating film of the conductive ball 46a is broken, so that the contact electrodes 57a and 57b of the inorganic light emitting device 50 and the pad electrodes 45a and 45b of the substrate 40 may be electrically connected to each other.

However, the plurality of inorganic light emitting devices 50 may be mounted on the substrate 40 through solder instead of the anisotropic conductive layer 46. After the inorganic light emitting devices 50 are aligned on the substrate 40, the inorganic light emitting devices 50 may be adhered to the substrate 40 through a reflow process.

The plurality of inorganic light emitting devices 50 may include red light emitting devices 51, green light emitting devices 52, and blue light emitting devices 53, and the light emitting device 50 may be mounted on the mounting surface 41 of the substrate 40 by combining a series of a red light emitting device 51, a green light emitting device 52, and a blue light emitting device 53 as one unit. A series of the red light emitting device 51, green light emitting device 52, and blue light emitting device 53 may form one pixel. In this case, the red light emitting device 51, the green light emitting device 52, and the blue light emitting device 53 may each form a sub pixel.

The red light emitting device 51, the green light emitting device 52, and the blue light emitting device 53 may be arranged in one line at a predetermined interval as in an embodiment of the present disclosure, or may be arranged in a different form such as a triangular form.

The substrate 40 may include a light absorbing layer 47 to improve contrast by absorbing external light. The light absorbing layer 47 may be formed on the entire mounting surface 41 side of the substrate 40. The light absorbing layer 47 may be formed between the TFT layer 44 and the anisotropic conductive layer 46.

The plurality of display modules 30A-30P may further include the black matrix 48 formed between the plurality of inorganic light emitting devices 50.

The black matrix 48 may perform a function of supplementing the light absorbing layer 47 formed entirely on the mounting surface 41 side of the substrate 40. That is, the black matrix 48 may absorb external light to make the substrate 40 appear black, thereby improving the contrast of the screen.

The black matrix 48 may suitably have a black color.

In the present embodiment, the black matrix 48 is formed to be disposed between pixels formed by a series of the red light emitting devices 51, the green light emitting devices 52, and the blue light emitting devices 53. However, unlike the present embodiment, the black matrix 48 may be formed more precisely to partition each of the light emitting devices 51, 52, and 53 which are sub-pixels.

The black matrix 48 may be formed in a grid shape having a horizontal pattern and a vertical pattern to be disposed between the pixels.

The black matrix 48 may be formed by applying a light-absorbing ink on the anisotropic conductive layer 46 through an ink-jet process and then curing the applied light-absorbing ink, or may be formed by coating a light-absorbing film on the anisotropic conductive layer 46.

That is, in the anisotropic conductive layer 46 formed entirely on the mounting surface 41, the black matrix 48 may be formed between the plurality of inorganic light emitting devices 50 on which the plurality of inorganic light emitting devices 50 is not mounted.

The plurality of display modules 30A-30P may each include a front cover 49 disposed on the mounting surface 41 in the first direction X to each cover the mounting surface 41 of the plurality of display modules 30A-30P.

A plurality of the front covers 49 may be respectively formed on the display modules 30A-30P in the first direction X.

The front cover 49 may include a film. The front cover 49 may include an adhesive layer provided such that the front cover 49 is adhered to the mounting surface 41 of the substrate 40.

The film of the front cover 49 may be provided as a functional film having optical performance.

The front cover 49 may protect the substrate 40 from an external force by being provided to cover the substrate 40.

In general, the adhesive layer of the front cover 49 may have a height greater than or equal to a predetermined height in the first direction X to which the mounting surface 41 or the light emitting surface 54 directs. This is to sufficiently fill a gap that may be formed between the front cover 49 and the plurality of inorganic light emitting devices 50 when the front cover 49 is disposed on the substrate 40.

Each of the plurality of display modules 30A-30P may include a metal plate 100 provided on the rear surface 42 of the substrate 40 to dissipate heat generated from the substrate 40.

Also, each of the plurality of display modules 30A-30P may include an adhesive layer 90 disposed between the rear surface 42 and the metal plate 100 to adhere the metal plate 100 to the rear surface 42 of the substrate 40.

Hereinafter, the metal plate 100 and the adhesive layer 90 described above, and components of the display module 30A disposed on the rear surface 42 of the substrate 40 will be described in detail.

Figure 4:
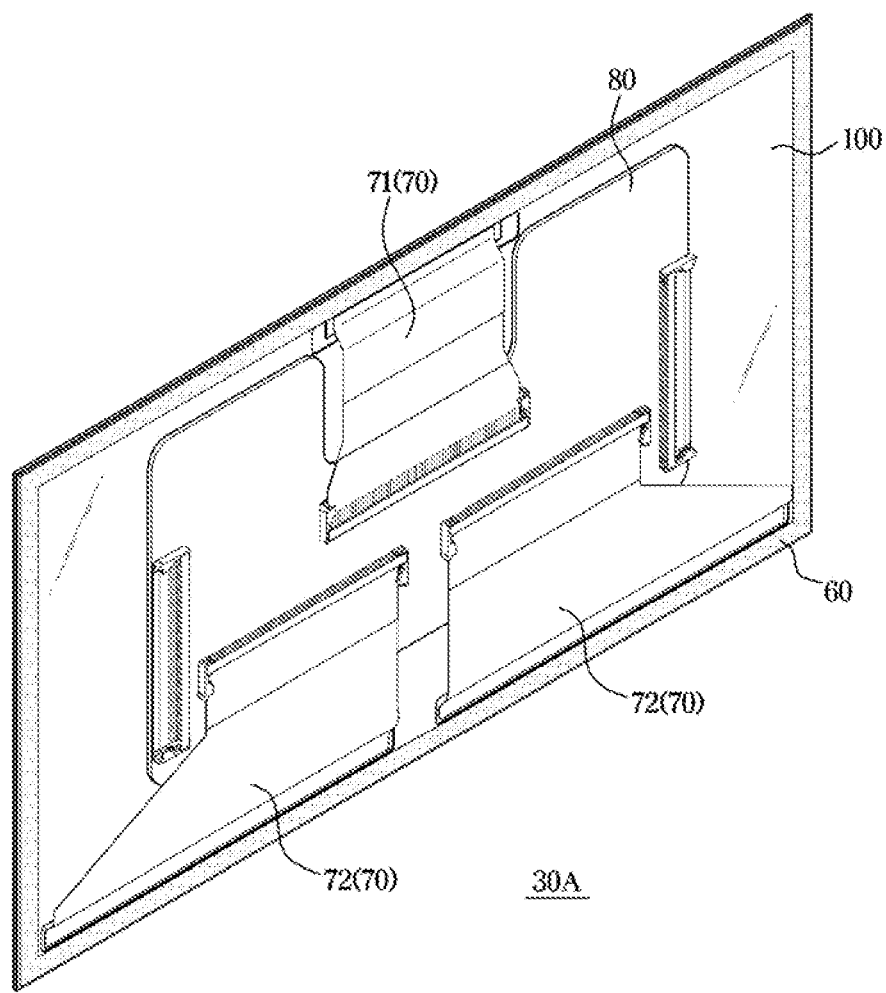
FIG. 4 is a rear perspective view of one display module of the display apparatus illustrated in FIG. 1 according to an embodiment of the disclosure.
Figure 5:
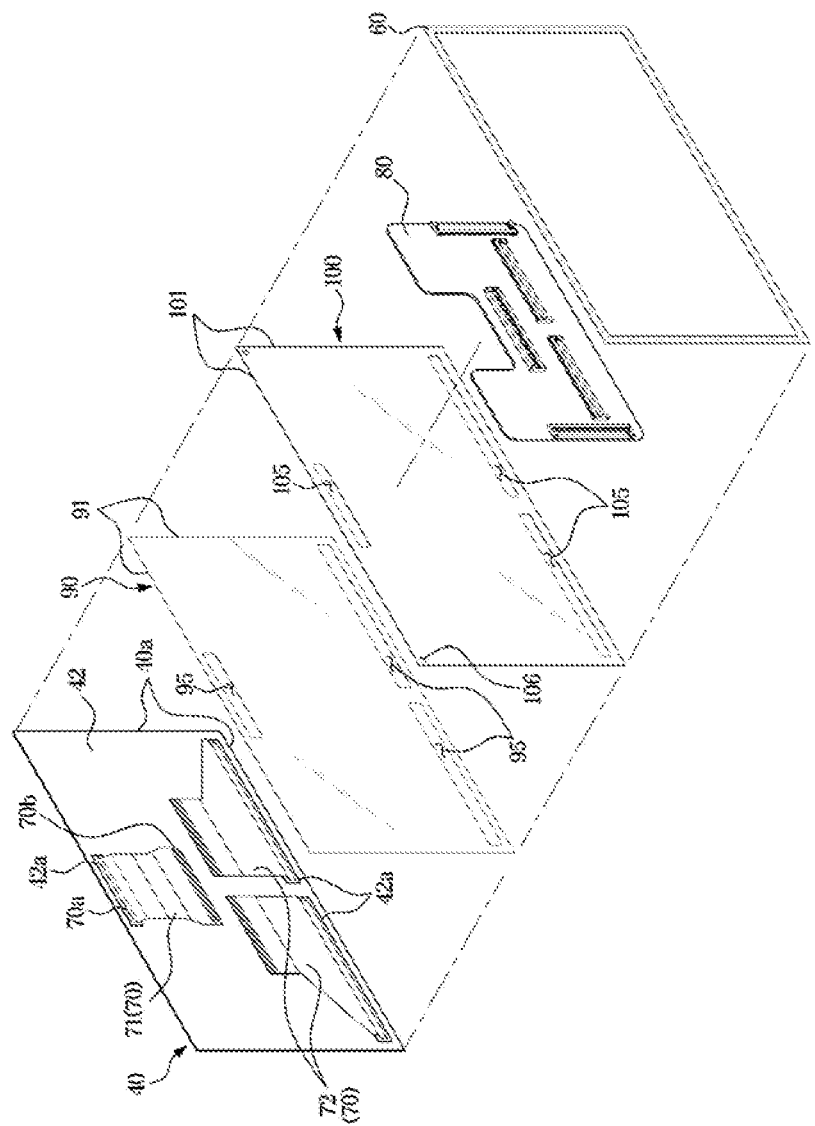
FIG. 5 is an exploded perspective view of one display module of the display apparatus illustrated in FIG. 1 according to an embodiment of the disclosure.
Figure 6:
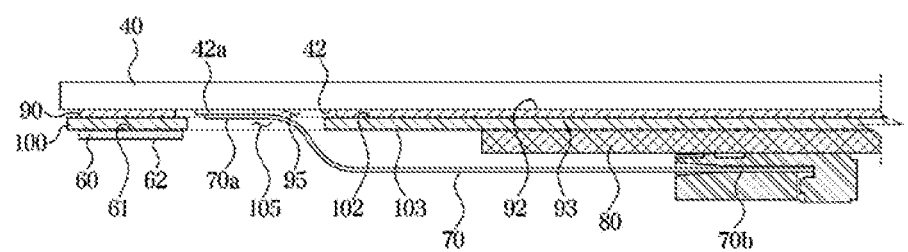
FIG. 6 is an enlarged cross-sectional view of components of one display module illustrated in FIG. 1 according to an embodiment of the disclosure.

FIG. 4 is a rear perspective view of one display module of the display apparatus illustrated in FIG. 1 according to an embodiment of the disclosure. FIG. 5 is an exploded perspective view of one display module of the display apparatus illustrated in FIG. 1 according to an embodiment of the disclosure. FIG. 6 is an enlarged cross-sectional view of components of one display module illustrated in FIG. 1 according to an embodiment of the disclosure.

Since the plurality of display modules 30A-30P is all configured identically, hereinafter, the first display module 30A will be described as a representative display module of the plurality of display modules 30A-30P in order to avoid duplication of description.

The display module 30A may include a driving circuit board 80 provided to electrically control the plurality of inorganic light emitting devices 50 mounted on the mounting surface 41. The driving circuit board 80 may be formed of a printed circuit board.

The driving circuit board 80 may control each driving by supplying power to the plurality of inorganic light emitting devices 50 and transmitting electrical signals. The driving circuit board 80 may be electrically connected to the inorganic light emitting devices 50.

The driving circuit board 80 may be disposed on the rear surface 42 of the substrate 40 in the first direction X.

The display module 30A may include a flexible film 70 connecting the driving circuit board 80 and the plurality of inorganic light emitting devices 50 so that the driving circuit board 80 is electrically connected to the plurality of inorganic light emitting devices 50.

The flexible film 70 may be formed as a flexible flat cable (FFC) or a chip on film (COF).

One end 70a of the flexible film 70 may be connected to the rear surface 42 of the substrate 40. Specifically, a connection pad 42a disposed on the rear surface 42 of the substrate 40 and electrically connected to the plurality of inorganic light emitting devices 50 may be connected to the end 70a of the flexible film 70. The other end 70b of the flexible film 70 may be connected to the driving circuit board 80.

The plurality of inorganic light emitting devices 50 may be sequentially connected to a pixel driving line formed on the mounting surface 41 and a side wiring extending through a side surface of the substrate 40 and electrically connected to the pixel driving wiring.

The connection pad 42a may be connected to the side wiring on the rear surface 42 of the substrate 40. Accordingly, the flexible film 70 and the plurality of inorganic light emitting devices 50 may be electrically connected.

As the flexible film 70 is electrically connected to the connection pad 42a, the flexible film 70 may transmit power and electrical signals from the driving circuit board 80 to the plurality of inorganic light emitting devices 50.

The flexible film 70 may include a first flexible film 71 and a second flexible film 72 respectively disposed in upward and downward directions with respect to the first direction X, which is the forward direction.

However, the present disclosure is not limited thereto, and the first and second flexible films 71 and 72 may be respectively disposed in left and right directions with respect to the first direction X, or in at least two directions of the upward, downward, left, and right directions.

A plurality of the second flexible films 72 may be provided. However, the present disclosure is not limited thereto. The single second flexible film 72 may be provided, and a plurality of the first flexible films 71 may also be provided.

The first flexible film 71 may transmit a data signal from the driving circuit board 80 to the substrate 40. The first flexible film 71 may include the COF.

The second flexible film 72 may transmit power from the driving circuit board 80 to the substrate 40. The second flexible film 72 may include the FFC.

However, the present disclosure is not limited thereto, and the first and second flexible films 71 and 72 may be formed opposite to the above.

The driving circuit board 80 may be electrically connected to the main board 25 (refer to FIG. 2). The main board 25 may be disposed on a rear side of the frame 21, and may be connected to the driving circuit board 80 through a cable at the rear of the frame 21.

As described above, the metal plate 100 may be in contact with the substrate 40. The metal plate 100 and the substrate 40 may be adhered to each other by the adhesive layer 90 disposed between the rear surface 42 of the substrate 40 and the metal plate 100.

The metal plate 100 may be formed of a metal material having high thermal conductivity. For example, the metal plate 100 may be made of an aluminum material.

Heat generated from the plurality of inorganic light emitting devices 50 and the TFT layer 44 mounted on the substrate 40 may be transferred to the metal plate 100 through the adhesive layer 90 along the rear surface 42 of the substrate 40.

Accordingly, heat generated from the substrate 40 may be easily transferred to the metal plate 100 and the substrate 40 may be prevented from rising above a certain temperature.

Heat additionally transferred to the metal plate 100 is transferred to the frame 21 supporting the rear side of the plurality of display modules 30A-30P, such that additional heat dissipation is possible.

As described above, the rear side of the plurality of display modules 30A-30P may be supported by the frame 21, and the metal plate 100 of each of the display modules 30A-30P may be in contact with the frame 21.

Accordingly, heat generated by each of the display modules 30A-30P may be radiated through each of the metal plates 100 or may be additionally transferred to the frame 21 to be radiated from the frame 21.

Each of the plurality of display modules 30A-30P may be arranged in various positions in the form of the M*N matrix. Each of the display modules 30A-30P is provided to be individually movable. In this case, each of the display modules 30A-30P may maintain a certain level of heat dissipation performance regardless of where each of the display modules 30A-30P is disposed, by individually including the metal plate 100.

The plurality of display modules 30A-30P may form various sizes of screens of the display apparatus 1 in the form of various M*N matrices. Accordingly, compared to heat dissipation through a single metal plate provided for heat dissipation, as in an embodiment of the present disclosure, individual heat dissipation by each of the display modules 30A-30P including the independent metal plate 100 may further improve the overall heat dissipation performance of the display apparatus 1.

When a single metal plate is disposed inside the display apparatus 1, a portion of the metal plate may not be disposed at positions corresponding to positions where some of the display modules are disposed based on a front-rear direction, and the metal plate may be disposed at positions where the display modules are not disposed, thereby reducing the heat dissipation efficiency of the display apparatus 1.

That is, through the metal plate 100 disposed on each of the display modules 30A-30P, regardless of where each of the display modules 30A-30P is disposed, each of the display modules 30A-30P may radiate heat by itself by each of the metal plates 100, thereby improving the overall heat dissipation performance of the display apparatus 1.

The metal plate 100 may have a rectangular shape substantially corresponding to the shape of the substrate 40.

An area of the substrate 40 may be at least equal to or greater than an area of the metal plate 100. When the substrate 40 and the metal plate 100 are arranged side by side in the first direction X, four edges 40a of the substrate 40 having the rectangular shape may be formed to correspond to four edges 101 of the metal plate 100 with respect to the center of the substrate 40 and the metal plate 100, or may be disposed more outside than the four edges 101 of the metal plate 100 with respect to the center of the substrate 40 and the metal plate 100.

According to an embodiment of the present disclosure, the area of the substrate 40 and the area of the metal plate 100 may substantially correspond. Accordingly, heat generated from the substrate 40 may be uniformly dissipated in the entire region of the substrate 40 without being isolated to a partial region.

The metal plate 100 may be adhered to the rear surface 42 of the substrate 40.

The display module 30A may include the adhesive layer 90 provided to adhere the metal plate 100 to the rear surface 42 of the substrate 40.

The adhesive layer 90 may have a size corresponding to that of the metal plate 100. That is, an area of the adhesive layer 90 may correspond to the area of the metal plate 100. The metal plate 100 may have a substantially rectangular shape, and the adhesive layer 90 may have a rectangular shape to correspond thereto.

Based on the center of the metal plate 100 and the adhesive layer 90, the four edges 101 of the metal plate 100 and four edges 91 of the adhesive layer 90, which have a rectangular shape, may be formed to correspond to each other.

Accordingly, the metal plate 100 and the adhesive layer 90 may be easily manufactured as a single combining structure, so that the entire manufacturing efficiency of the display apparatus 1 may be increased.

That is, when the metal plate 100 is cut in a unit number from a single plate, the adhesive layer 90 may be first adhered to the single plate before the metal plate 100 is cut, and the adhesive layer 90 and the metal plate 100 may be simultaneously cut in the unit number, so that the manufacturing process may be reduced.

Heat generated from the substrate 40 may be transferred to the metal plate 100 through the adhesive layer 90. Accordingly, the adhesive layer 90 may be provided to adhere the metal plate 100 to the substrate 40 and transfer heat generated from the substrate 40 to the metal plate 100 at the same time.

Accordingly, the adhesive layer 90 may include a material having high heat dissipation performance. The adhesive layer 90 may include a material having adhesiveness to adhere the substrate 40 and the metal plate 100.

Additionally, the adhesive layer 90 may include a material having high heat dissipation performance rather than a material having general adhesiveness. Accordingly, the adhesive layer 90 between the substrate 40 and the metal plate 100 may efficiently transfer heat to each component.

In addition, the material of the adhesive layer 90 having the adhesiveness may be formed to have higher heat dissipation performance than an adhesive material having general adhesiveness.

A material having high heat dissipation performance refers to a material that may effectively transfer heat by having a high thermal conductivity, excellent heat transfer performance, and low specific heat.

As an example, the adhesive layer 90 may include a graphite material. However, the present disclosure is not limited thereto, and the adhesive layer 90 may be generally made of a material having high heat dissipation performance.

Ductility of the adhesive layer 90, which will be described later, may be superior to (i.e., greater than) a ductility of the substrate 40 and the metal plate 100.

Therefore, the adhesive layer 90 may be made of a material having excellent ductility while having the adhesiveness and heat dissipation performance.

The adhesive layer 90 may be formed of an inorganic double-sided tape. The adhesive layer 90 may include a first surface 92 adhered to the rear surface 42 of the substrate 40, and a second surface 93 disposed opposite to the first surface 92 and adhered to the metal plate 100.

As described above, since the adhesive layer 90 is formed of an inorganic tape, the adhesive layer 90 may be formed as a single layer without a member supporting the first surface 92 and the second surface 93 between the first surface 92 and the second surface 93.

Since the adhesive layer 90 does not include a member, heat conduction is not hindered, and thus the heat dissipation performance may be increased.

However, the adhesive layer 90 is not limited to the inorganic double-sided tape, and may be provided as a heat-dissipating tape having better heat dissipation performance than a general double-sided tape.

The metal plate 100 may include a metal plate cutout portion 105 provided to allow the flexible film 70 extending from the substrate 40 to penetrate the metal plate 100.

The metal plate cutout portion 105 may be provided such that the flexible film 70 penetrates the metal plate 100 from the rear surface 42 of the substrate 40 and extends to the driving circuit board 80 disposed at the rear of the metal plate 100 in a direction to which the rear surface 42 directs.

Since the metal plate 100 has a size substantially corresponding to the substrate 40, a region in which the flexible film 70 extending from the rear surface 42 of the substrate 40 may penetrate the metal plate 100 is required when the metal plate 100 is adhered to the rear surface 42 of the substrate 40.

This is due to adhesion between the metal plate 100 and the rear surface 42 of the substrate 40 being limited by the flexible film 70 and the connection of the flexible film 70 to the driving circuit board 80 disposed outside the substrate 40 may be limited by the metal plate 100.

Therefore, although the metal plate 100 includes the metal plate cutout portion 105 and the flexible film 70 extends rearward from the rear surface 42 of the substrate 40 through the metal plate cutout portion 105, the metal plate 100 may have a size corresponding to that of the substrate 40. The flexible film 70 may extend from the edge 40a side of the substrate 40. In the display apparatus 1 according to an embodiment of the present disclosure, since the plurality of display modules 30A-30P may form the screen of the display apparatus 1 in the form of various M*N matrices, when the flexible film 70 is extended from the edge 40a side of the substrate 40, a gap greater than is necessary may be generated between the respective display modules 30A-30P when the plurality of display modules 30A-30P is arrayed.

Accordingly, it is suitable for the flexible film 70 to extend from the rear surface 42 of the substrate 40. That is, the connection pad 42a connected to the flexible film 70 is disposed on the rear surface 42 of the substrate 40 so that the flexible film 70 may be connected to the substrate 40 on the rear surface 42 of the substrate 40.

As described above, although the metal plate 100 is formed to have a size corresponding to the size of the substrate 40, since the metal plate 100 additionally includes the metal plate cutout portion 105, the flexible film 70 may easily penetrate the metal plate 100, and thus the metal plate 100 and the rear surface 42 of the substrate 40 may be easily adhered.

The number of the metal plate cutout portions 105 may correspond to the number of the flexible films 70.

As described above, the flexible film 70 includes the first flexible film 71 and the second flexible film 72, and thus the number of the metal plate cutout portions 105 may correspond to the number of the first flexible films 71 and the number of the second flexible films 72, respectively.

The metal plate cutout portion 105 may be formed at a position corresponding to a position where the one end 70a of the flexible film 70 to which the flexible film 70 is connected to the rear surface 42 is disposed in the first direction X.

Accordingly, the flexible film 70 may easily penetrate the metal plate cutout portion 105 in the first direction X.

The metal plate cutout portion 105 is a region in which a portion of the metal plate 100 is cut. According to an embodiment of the present disclosure, the metal plate cutout portion 105 may have the shape of a passing hole.

The metal plate cutout portion 105 may include a passing hole formed at a position corresponding to the position where the one end 70a of the flexible film 70 is disposed. When a plurality of the one ends 70a of the flexible film 70 is provided, a plurality of the passing holes may also be provided to correspond thereto.

However, the present disclosure is not limited thereto, and the metal plate cutout portion 105 may not have the shape of a passing hole, but may have a shape of being cut from the edge 101 of the metal plate 100 to a partial region.

That is, the metal plate cutout portion 105 may be formed to be cut from the edge 101 of the metal plate 100 to the region where the one end 70a of the flexible film 70 is disposed.

The adhesive layer 90 may include an adhesive layer cutout portion 95 provided to allow the flexible film 70 extending from the rear surface 42 of the substrate 40 to penetrate the adhesive layer 90 and penetrate the metal plate 100.

As described above, since the adhesive layer 90 is formed between the rear surface 42 and the metal plate 100, the flexible film 70 penetrates the adhesive layer 90 before penetrating the metal plate 100. Accordingly, when the adhesive layer 90 is formed to have a size corresponding to that of the metal plate 100 as in an embodiment of the present disclosure, the adhesive layer 90 may include the adhesive layer cutout portion 95.

The adhesive layer cutout portion 95 may be formed to correspond to the metal plate cutout portion 105 in the first direction X. The adhesive layer cutout portions 95 may include a number corresponding to the number of the metal plate cutout portions 105, and may be disposed at corresponding positions.

Since the adhesive layer 90 is formed to have a size corresponding to that of the metal plate 100, the adhesive layer cutout portion 95 also may be provided in a shape, position, and number corresponding to those of the metal plate cutout portion 105.

As described above, since the metal plate 100 and the adhesive layer 90 may be manufactured as a single combining configuration, as the adhesive layer cutout portion 95 and the metal plate cutout portion 105 correspond to each other, the adhesive layer cutout portion 95 and the metal plate cutout portion 105 may also be formed through a single process, thereby increasing the manufacturing efficiency.

The driving circuit board 80 may be disposed at the rear of the substrate 40. Specifically, the driving circuit board 80 may be disposed at the rear of the metal plate 100 in the direction to which the rear surface 42 directs.

The other end 70b of the flexible film 70 may be connected to the driving circuit board 80 disposed at the rear of the metal plate 100 by sequentially penetrating the adhesive layer cutout portion 95 and the metal plate cutout portion 105 from the rear surface 42 of the substrate 40.

The driving circuit board 80 may be disposed on the metal plate 100. The driving circuit board 80 may be adhered to the metal plate 100.

The first surface 102 of the metal plate 100 may be adhered to the rear surface 42 of the substrate 40 through the adhesive layer 90. The driving circuit board 80 may be disposed on the second surface 103 of the metal plate 100 disposed on an opposite side of the first surface 102.

The driving circuit board 80 may be adhered to the second surface 103 of the metal plate 100.

Since heat may be generated when the driving circuit board 80 is driven and the driving circuit board 80 and the second surface 103 are in contact with each other, the heat generated from the driving circuit board 80 is easily transferred to the metal plate 100, such that the heat generated from the driving circuit board 80 as well as the substrate 40 may be easily transferred to the metal plate 100, thereby increasing the heat dissipation efficiency of the display module 30A.

As described above, since the substrate 40 is made of a glass material and the metal plate 100 is made of a metal material, the components may have different coefficients of thermal expansion. When heat is generated from the substrate 40, the substrate 40 and the metal plate 100 may thermally expand to different sizes by heat, respectively. Accordingly, a problem in which the display module 30A is damaged may occur.

The above problem is due to the substrate 40 and the metal plate 100 having different values of expansion at the same temperature in a state in which the substrate 40 and the metal plate 100 are fixed to each other, and thus as the substrate 40 and the metal plate 100 expand to different sizes, stress may be generated in each component.

Since in general, a coefficient of thermal expansion of metal is greater than that of glass, when the same heat is transferred to the substrate 40 and the metal plate 100, the metal plate 100 may be expanded and deformed more than the substrate 40.

Conversely, even when heat generation in the substrate 40 is terminated and the substrate 40 and the metal plate 100 are cooled, respectively, the metal plate 100 may be contracted and deformed more than the substrate 40.

Since the substrate 40 and the metal plate 100 are in a state of being adhered to each other by the adhesive layer 90, an external force may be transmitted to the substrate 40 when the metal plate 100 is deformed much than the substrate 40.

Conversely, an external force may also be transmitted to the metal plate 100 by the substrate 40, but due to rigidity of the substrate 40 having a glass material being less than that of the metal plate 100 having a metal material, the substrate 40 may be damaged.

The adhesive layer 90 may absorb external forces transmitted from the substrate 40 and the metal plate 100 as the substrate 40 and the metal plate 100 expand to different sizes.

Accordingly, transmission of external force to the substrate 40 and the metal plate 100, and in particular, damage to the substrate 40 may be prevented may be prevented.

The adhesive layer 90 may be made of a material having excellent ductility. Specifically, the ductility of the adhesive layer 90 may be superior to the ductility of the substrate 40 and the ductility of the metal plate 100.

Accordingly, as the adhesive layer 90 itself is deformed when an external force generated from a change in the sizes of the substrate 40 and the metal plate 100 is transmitted to the adhesive layer 90, transmission of the external force to different components may be prevented.

The adhesive layer 90 may have a predetermined thickness in the first direction X. When heat is transferred to the metal plate 100 and the metal plate 100 is thermally expanded or cooled and contracted, the metal plate 100 may expand or contract not only in the first direction X, but also in a direction orthogonal to the first direction X, and thus an external force may be transmitted to the substrate 40.

Even when the metal plate 100 expands or contracts in the direction orthogonal to the first direction X, transmission of an external force to the substrate 40 may be prevented as the thickness of the adhesive layer 90 is changed. Additionally, a coefficient of thermal expansion of the adhesive layer 90 may be different from the coefficient of thermal expansion of the substrate 40 and the thermal expansion coefficient of the metal plate 100.

The coefficient of thermal expansion of the adhesive layer 90 may be greater than the coefficient of thermal expansion of the substrate 40 and less than the coefficient of thermal expansion of the metal plate 100.

Accordingly, the adhesive layer is not deformed equally with any one of the substrate 40 and the metal plate 100 at the same temperature, and may cushion deformation of the respective components between the substrate 40 and the metal plate 100.

Therefore, the adhesive layer 90 is disposed between the substrate 40 and the metal plate 100 and may easily absorb an external force that is generated depending on the difference in the thermal expansion coefficients of the substrate 40 and the metal plate 100 through deformation.

A thickness t1 of the substrate 40 may be formed to be at least twice as thick as a thickness t2 of the metal plate 100.

This is to reduce an external force that may be transmitted to the substrate 40 when a temporary distortion phenomenon occurs in the display module 30A due to thermal expansion since a rigidity of the metal plate 100 is higher than that of the substrate 40 as described above.

In addition, since the substrate 40 is formed of a glass material and the metal plate 100 is formed of a metal material, a degree of flatness of the finished glass plate may be more uniform than a degree of flatness of the metal plate.

Accordingly, the substrate 40 and the metal plate 100 may be slightly different in the degree of flatness, and since the substrate 40 and the metal plate 100 come into contact with and are coupled to each other as described above, stress may be generated in the respective components depending on the degree of flatness.

In particular, since the rigidity of the substrate 40 is low, the substrate 40 may be damaged, and in order to reduce an external force to be transmitted to the substrate 40, the thickness t1 of the substrate 40 may be suitably at least twice as thick as the thickness t2 of the metal plate 100.

However, this is an example value, and the thickness t2 of the metal plate 100 may be thicker than ½ of the thickness t1 of the substrate 40.

The metal plate 100 may include a marking hole 106 disposed adjacent to the edge 101 side of the metal plate 100. The marking hole 106 may include a hole penetrating the metal plate 100.

The marking hole 106 may be provided such that when the display module 30A is arrayed on the frame 21, an operator may check a marking displayed on the frame 21. Therefore, the marking hole 106 may be provided to determine a position of the display module 30A on the frame 21.

As described above, since the metal plate 100 is formed to have a size corresponding to that of the substrate 40 to cover the entire rear surface 42 of the substrate 40, when the display module 30A is arrayed on the frame 21, the position of the display module 30A on the frame 21 may be checked through the marking hole 106 penetrating the metal plate 100.

The display module 30A may include the coupling member 60 provided to couple the frame 21 and the display module 30A.

The coupling member 60 may be provided such that the second surface 103 of the metal plate 100 and the frame 21 are adhered thereto.

The coupling member 60 may include a double-sided adhesive tape having a first surface 61 adhered to the second surface 103 of the metal plate 100 and a second surface 62 adhered to the frame 21.

As described above, since the metal plate 100 is formed to have a size corresponding to the substrate 40 to be provided to cover the entire rear surface 42 of the substrate 40, the coupling member 60 may be disposed on the second surface 103 of the metal plate 100.

When the display module 30A is coupled to the frame 21, the driving circuit board 80 and the flexible film 70 positioned at the rear of the metal plate 100 may be disposed on an opening 21a of the frame 21, and the second surface 103 of the metal plate 100 may be disposed to be in contact with the frame 21 by the coupling member 60.

Adhesiveness of the first surface 61 of the coupling member 60 may be stronger than that of the second surface 62. This is because, while the display apparatus 1 is used, the second surface 62 of the coupling member 60 and the frame 21 may be detachable in some cases.

Since the display module 30A needs to be separated from the frame 21 when the display module 30A is damaged and required to be separated and replaced from the display apparatus 1, the adhesiveness of the first surface 61 of the coupling member 60 may be stronger than that of the second surface 62.

Hereinafter, the display module 30A of the display apparatus 1 according to another embodiment of the present disclosure will be described. Components other than a metal plate 200 and an adhesive layer 190 of the display module 30A, which will be described below, are the same as those of the display module 30A according to an embodiment of the present disclosure, and thus descriptions of the same components will be omitted.

Figure 7:
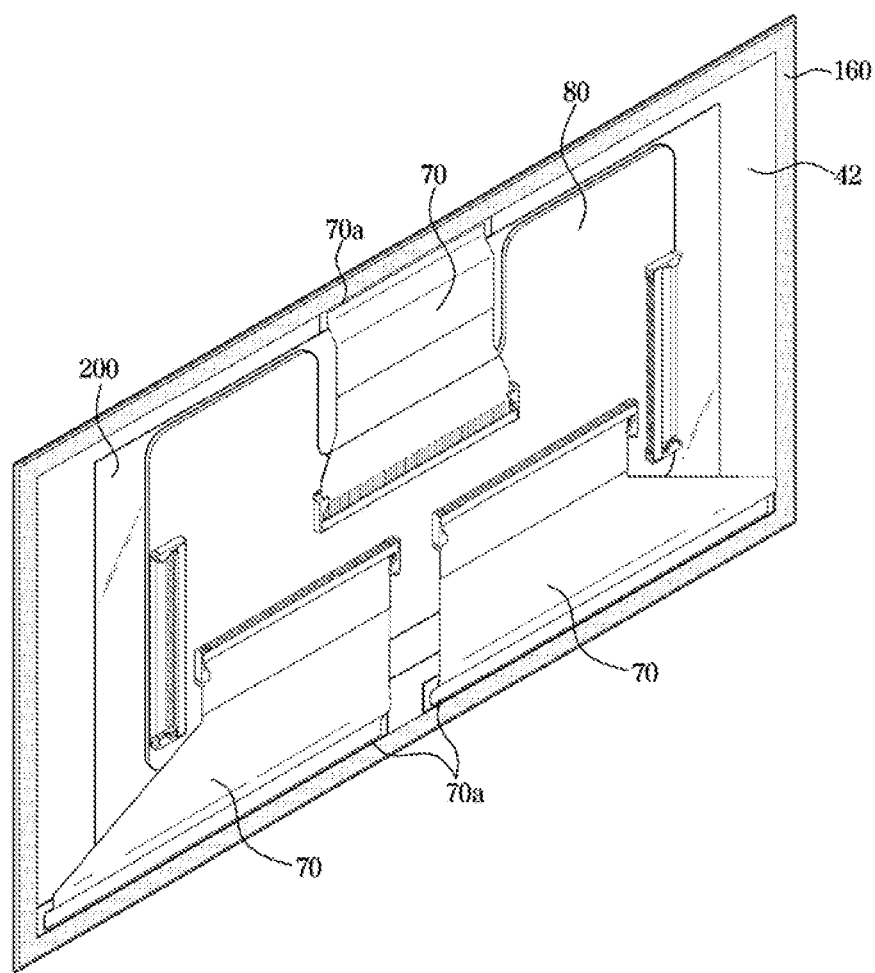
FIG. 7 is a rear perspective view of a display module of a display apparatus according to an embodiment of the disclosure.
Figure 8:
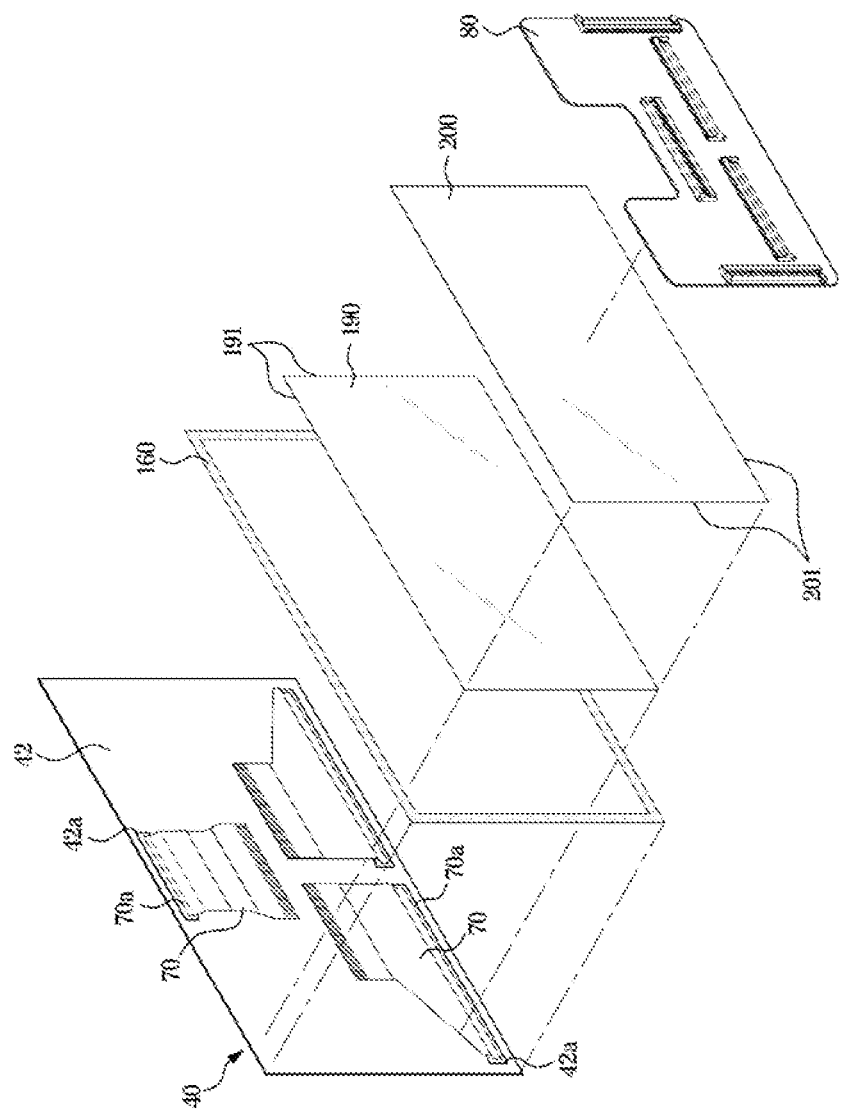
FIG. 8 is an exploded perspective view of one display module of the display apparatus illustrated in FIG. 7 according to an embodiment of the disclosure.
Figure 9:
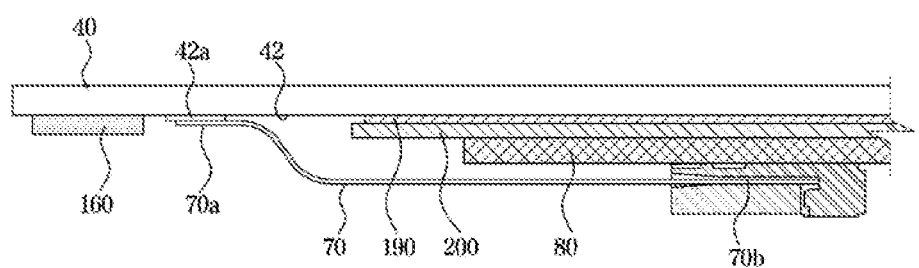
FIG. 9 is an enlarged cross-sectional view of components of one display module illustrated in FIG. 7 according to an embodiment of the disclosure.

FIG. 7 is a rear perspective view of a display module of a display apparatus according to an embodiment of the disclosure. FIG. 8 is an exploded perspective view of one display module of the display apparatus illustrated in FIG. 7 according to an embodiment of the disclosure. FIG. 9 is an enlarged cross-sectional view of components of one display module illustrated in FIG. 7 according to an embodiment of the disclosure.

As illustrated in FIGS. 7 to 9, the metal plate 200 may be disposed on the rear surface 42 of the substrate 40. Specifically, the metal plate 200 may be adhered to the rear surface 42 of the substrate 40 by the adhesive layer 190.

The metal plate 200 may have a rectangular shape substantially corresponding to the shape of the substrate 40.

An area of the metal plate 200 may be less than the area of the substrate 40. When the substrate 40 and the metal plate 200 are arranged side by side in the first direction X, the four edges 40a of the substrate 40 having the rectangular shape may be disposed more outside than four edges 201 of the metal plate 200 with respect to the center of the substrate 40 and the metal plate 200.

Specifically, when the substrate 40 and the metal plate 200 are arranged side by side in the first direction X, the four edges 201 of the metal plate 200 may be positioned more inside than the position where the end 70a of the flexible film 70 is disposed with respect to the center of the substrate 40 and the metal plate 200.

Accordingly, the flexible film 70 may be connected to the driving circuit board 80 disposed at the rear of the metal plate 200 without penetrating the metal plate 200.

An area of the adhesive layer 190 disposed between the substrate 40 and the metal plate 200 may be correspond to the area of the metal plate 200.

When the substrate 40 and the metal plate 200 are arranged side by side in the first direction X, four edges 191 of the adhesive layer 190 may be positioned more inside than the position where the one end 70a of the flexible film 70 is disposed with respect to the center of the substrate 40 and the metal plate 200 to correspond to the four edges 201 of the metal plate 200.

Therefore, the flexible film 70 may be connected to the driving circuit board 80 disposed at the rear of the metal plate 200 without penetrating the adhesive layer 190.

The display module 30A may include a coupling member 160 provided to couple the frame 21 and the display module 30A.

The coupling member 160 may be provided such that the rear surface 42 of the substrate 40 and the frame 21 are adhered thereto.

In the case of an embodiment of the present disclosure described above, the coupling member 60 is disposed on the second side 103 of the metal plate 100 due to the metal plate 100 being formed to have a size corresponding to the size of the substrate 40 to cover the entire rear surface 42 of the substrate 40. However, since the metal plate 200 according to one embodiment of the present disclosure covers only a portion of the rear surface 42 of the substrate 40, the coupling member 160 may be provided to be adhered to a region that is not covered by the metal plate 200 in the rear surface 42 of the substrate 40.

The coupling member 160 may include a double-sided adhesive tape having a first surface 161 adhered to the rear surface 42 of the substrate 40 and a second surface 162 adhered to the frame 21.

As the coupling member 160 of the display module 30A according to another embodiment of the present disclosure is provided to be directly adhered to the substrate 40, when the plurality of display modules 30A-30P is arrayed on and adhered to the frame 21, the uniformity of heights of the respective display modules 30A-30P in the first direction X may be constantly maintained.

That is, in the case of the coupling member 60 of the display module 30A according to an embodiment of the present disclosure, the substrate 40, the adhesive layer 90, the metal plate 100, and the coupling member 60 are disposed to overlap in the first direction X, such that the uniformity of the heights of the respective display modules 30A-30P in the first direction X may deteriorate.

However, as described above, as the coupling member 160 of the display module 30A according to another embodiment of the present disclosure is directly adhered to the substrate 40, the uniformity of the heights of the respective display modules 30A-30P in the first direction X may be further constantly maintained.

Hereinafter, the display apparatus 1 according to an embodiment of the present disclosure will be described. Components other than a cover glass 29, which will be described below, are the same as those of the display apparatus 1 according to an embodiment of the present disclosure described above, and thus descriptions of the same components will be omitted.

Figure 10:
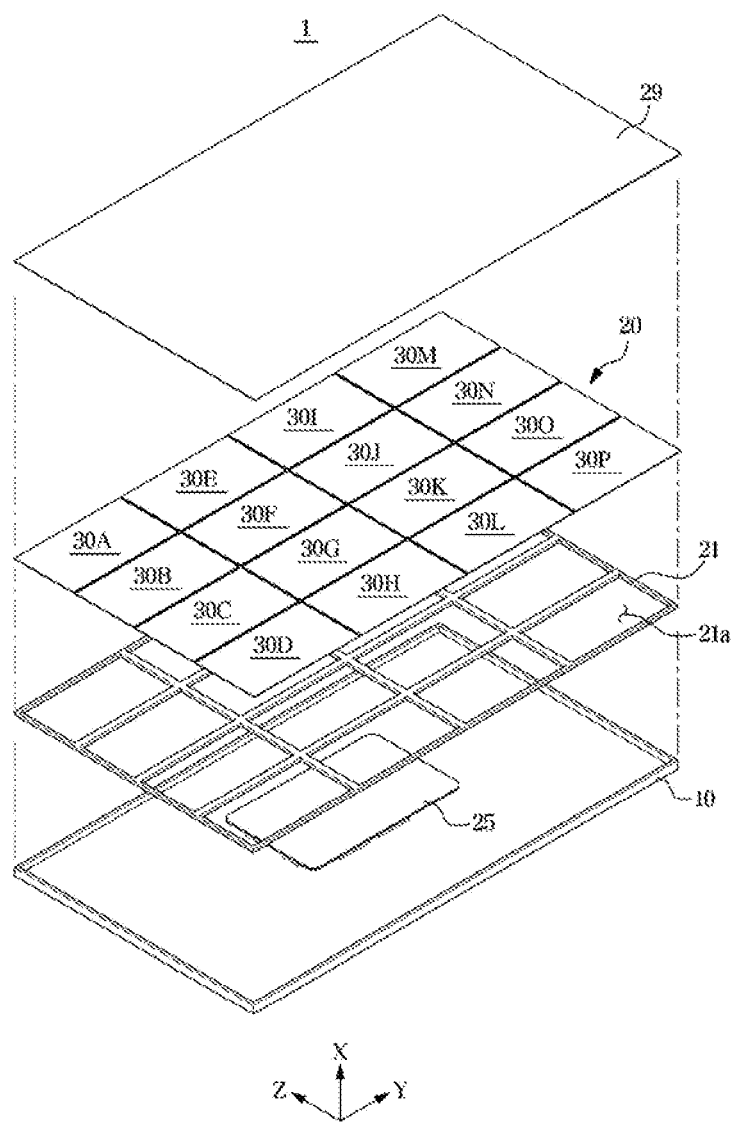
FIG. 10 is an exploded view illustrating components of a display apparatus according to an embodiment of the disclosure.

FIG. 10 is an exploded view illustrating components of a display apparatus according to an embodiment of the disclosure.

As illustrated in FIG. 10, the display apparatus 1 may include the cover glass 29 provided to cover the display panel 20 in the front of the display panel 20.

The cover glass 29 may be provided to be coupled to the frame 21.

The cover glass 29 may be disposed in front of the display panel 20 in the first direction X to protect the display panel 20 from an external force.

In a conventional case, when a plurality of display modules 30A-30P is supported on the frame 21 in a matrix form of M*N, the plurality of display modules 30A-30P is provided to be arranged in advance on the cover glass 29 and adhered to the cover glass 29 and then coupled to the frame 21 together with the cover glass 29.

In addition, a transparent adhesive layer is applied between the plurality of display modules 30A-30P and the cover glass 29 to adhere the plurality of display modules 30A-30P and the cover glass 29, and as the plurality of display modules 30A-30P and the cover glass 29 are integrally coupled to the frame 21, the plurality of display modules 30A-30P may be supported on the frame 21.

However, each of the plurality of display modules 30A-30P of the display apparatus 1 according to another embodiment of the present disclosure independently includes the metal plate 100 and the coupling member 90 disposed on the metal plate 100.

Therefore, unlike the case in which the plurality of display modules 30A-30P is preferentially arrayed on the cover glass 29, each of the display modules 30A-30P may be independently directly arrayed on the frame 21 and coupled to the frame 21.

Therefore, the manufacturing process of the display apparatus 1 may be reduced, and thus the efficiency of the process may be increased. In addition, since the plurality of display modules 30A-30P does not need to be preferentially arrayed on the cover glass 29, the cover glass 29 may not be regarded as an essential component of the display apparatus 1, and thus the display apparatus 1 may not include the cover glass 29.

That is, the display apparatus 1 may include or not include the cover glass 29 as necessary.

Although the foregoing has illustrated and described specific embodiments, it should be understood by those of skilled in the art that the disclosure is not limited to the above-described embodiments. Various changes and modifications may be made without departing from the technical idea of the disclosure described in the following claims.

What is claimed is:
1. A display module comprising:
a substrate comprising a mounting surface on which a plurality of inorganic light emitting devices is mounted and a rear surface opposite the mounting surface;
a metal plate facing the rear surface;
an adhesive layer provided between the rear surface of the substrate and the metal plate;
a driving circuit board provided at the rear of the metal plate in a direction in which the rear surface faces; and
a flexible film penetrating the metal plate and connecting the substrate to the driving circuit board,
wherein an area of the substrate is equal to or greater than an area of the metal plate,
wherein the adhesive layer has an area corresponding to an area in which the metal plate faces the substrate, wherein a coefficient of thermal expansion of the substrate is less than a coefficient of thermal expansion of the metal plate, and wherein a ductility of the adhesive layer is greater than a ductility of the substrate and a ductility of the metal plate.

2. The display module of claim 1, wherein the flexible film comprises a first end connected to the substrate and a second end connected to the driving circuit board such that the flexible film electrically connects the plurality of inorganic light emitting devices and the driving circuit board.

3. The display module of claim 2, wherein the metal plate comprises a metal plate cutout portion through which the flexible film to penetrates the metal plate.

4. The display module of claim 3, wherein the substrate further comprises a connection pad provided on the rear surface of the substrate to connect the plurality of inorganic light emitting devices and the first end of the flexible film, and wherein the metal plate cutout portion is formed at a position where the connection pad and the first end of the flexible film are connected in the direction in which the rear surface faces.

5. The display module of claim 4, wherein the metal plate cutout portion comprises a passing hole configured to allow the flexible film to penetrate the metal plate.

6. The display module of claim 3, wherein the adhesive layer comprises an adhesive layer cutout portion configured to allow the flexible film to penetrate the adhesive layer.

7. The display module of claim 6, wherein the substrate further comprises a connection pad provided on the rear surface and configured to connect the plurality of inorganic light emitting devices and the first end of the flexible film, and wherein the adhesive layer cutout portion comprises a passing hole formed at a position where the connection pad and the first end of the flexible film are connected.

8. The display module of claim 3, wherein the adhesive layer comprises an adhesive layer cutout portion configured to allow the flexible film to penetrate the adhesive layer, and wherein the adhesive layer cutout portion is provided at a position corresponding to a position of the metal plate cutout portion.

9. The display module of claim 8, wherein the metal plate cutout portion has a shape corresponding to a shape of the adhesive layer cutout portion.

10. The display module of claim 1, wherein the adhesive layer comprises an inorganic adhesive tape comprising a first surface adhered to the rear surface and a second surface adhered to the metal plate.

11. The display module of claim 10, wherein the adhesive layer is formed by mixing a first material comprising an adhesiveness and a second material having a higher heat dissipation performance than the first material.

12. The display module of claim 2, wherein the metal plate comprises a first surface facing the adhesive layer and a second surface opposite side the first surface, and wherein the driving circuit board is provided on the second surface of the metal plate.

13. The display module of claim 2, wherein the metal plate is provided on the rear surface at a position that is more inside with respect to a center of the substrate than a position where the first end of the flexible film is connected to the substrate.

14. A display apparatus comprising a display module array comprising a plurality of display modules horizontally arranged in an M*N matrix, wherein each of the plurality of display modules comprises:

a substrate comprising a mounting surface on which a plurality of inorganic light emitting devices is mounted and a rear surface opposite the mounting surface;

a metal plate facing the rear surface of the substrate and configured to dissipate heat generated from the substrate;

an adhesive layer provided between the rear surface of the substrate and the metal plate;

a driving circuit board provided at the rear of the metal plate in a direction in which the rear surface faces; and a flexible film penetrating the metal plate and connecting the substrate to the driving circuit board, wherein an area of the substrate is equal to or greater than an area of the metal plate, wherein the adhesive layer has an area corresponding to an area of the metal plate, wherein a coefficient of thermal expansion of the substrate is less than a coefficient of thermal expansion of the metal plate, and wherein a ductility of the adhesive layer is greater than a ductility of the substrate and a ductility of the metal plate.

15. The display apparatus of claim 14, further comprising a chassis on which the display modules are supported, wherein each of the display modules further comprises a coupling member comprising a first surface adhered to each of the plurality of display modules and a second surface adhered to the chassis such that the chassis and each of the plurality of display modules are coupled.

* * * * *